(12) United States Patent
Klingman et al.

(10) Patent No.: US 6,947,043 B1
(45) Date of Patent: Sep. 20, 2005

(54) METHOD OF OPERATING AN OSCILLOSCOPE

(75) Inventors: Kayla R. Klingman, Portland, OR (US); Scott A. Davidson, Hillsboro, OR (US)

(73) Assignee: Tektronix, Inc., Beaverton, OR (US)

( * ) Notice: Subject to any disclaimer, the term of this patent is extended or adjusted under 35 U.S.C. 154(b) by 0 days.

(21) Appl. No.: 09/536,205

(22) Filed: Mar. 27, 2000

(51) Int. Cl.$^7$ ............................................. G01R 13/02
(52) U.S. Cl. .................... 345/440.1; 345/440; 345/691; 345/208; 702/66; 702/67; 702/71; 702/72; 702/73
(58) Field of Search ................................ 345/324, 440, 345/440.1, 691, 208, 53, 94; 702/66, 67–74

(56) References Cited

U.S. PATENT DOCUMENTS

| | | | |
|---|---|---|---|
| 4,072,851 A | | 2/1978 | Rose |
| 4,104,725 A | | 8/1978 | Rose et al. |
| 4,134,149 A | | 1/1979 | Nord |
| 4,510,571 A | * | 4/1985 | Dagostino et al. ............ 702/67 |
| 4,642,519 A | | 2/1987 | Nakatsugawa et al. |
| 4,656,598 A | | 4/1987 | Wilson |
| 4,766,425 A | | 8/1988 | Tallman et al. |
| 4,829,293 A | | 5/1989 | Schlater |
| 4,855,968 A | * | 8/1989 | Shank ......................... 368/115 |
| 4,906,916 A | | 3/1990 | Koslar |
| 4,974,167 A | | 11/1990 | Anderson et al. |
| 5,039,937 A | | 8/1991 | Mandt et al. |
| 5,123,034 A | * | 6/1992 | Grujon ......................... 377/19 |
| 5,222,028 A | | 6/1993 | LaBarre et al. |
| 5,295,080 A | | 3/1994 | Averill |
| 5,375,067 A | * | 12/1994 | Berchin ....................... 702/66 |
| 5,446,650 A | | 8/1995 | Overhage et al. |
| 5,684,850 A | | 11/1997 | Warburton et al. |
| 5,706,203 A | | 1/1998 | Kawauchi |
| 5,742,276 A | * | 4/1998 | Taraki ......................... 345/134 |
| 5,778,328 A | * | 7/1998 | Trsar et al. .................... 701/29 |
| 5,806,517 A | * | 9/1998 | Gerhardt et al. ............. 600/345 |
| 5,852,789 A | * | 12/1998 | Trsar et al. ................... 701/102 |
| 5,854,996 A | | 12/1998 | Overhage et al. |
| 5,898,307 A | | 4/1999 | Taraki et al. |
| 5,986,637 A | * | 11/1999 | Etheridge et al. ............ 345/134 |
| 6,163,758 A | * | 12/2000 | Sullivan et al. ............... 702/66 |
| 6,188,384 B1 | * | 2/2001 | Sullivan et al. ........... 345/440.1 |
| 6,201,384 B1 | * | 3/2001 | Alexander .................... 324/121 |
| 6,301,547 B2 | * | 10/2001 | Felps ............................ 702/67 |
| 6,421,619 B1 | * | 7/2002 | Daniels et al. ................. 702/66 |
| 6,525,525 B1 | * | 2/2003 | Azinger .................... 324/121 R |
| 6,571,185 B1 | * | 5/2003 | Gauland et al. ............... 702/68 |

* cited by examiner

*Primary Examiner*—Almis R. Jankus
*Assistant Examiner*—Daniel Chung
(74) *Attorney, Agent, or Firm*—John Smith-Hill; William K. Bucher; Thomas F. Lenihan

(57) ABSTRACT

An oscilloscope that is capable of displaying simultaneously multiple waveforms representing time evolution of a signal during respective acquisition intervals acquires waveform data using a first set of acquisition parameters and generates a display based on that waveform data. If the display includes a waveform that is visually distinct from other displayed waveforms, the user selects a feature that distinguishes the visually distinct waveform from other displayed waveforms. The oscilloscope automatically derives updated acquisition parameters that discriminate between the selected feature and other features of the displayed waveforms. The oscilloscope then acquires waveform data using the updated acquisition parameters and generates a display based on that waveform data.

6 Claims, 2 Drawing Sheets

METHOD OF OPERATING AN OSCILLOSCOPE

BACKGROUND OF THE INVENTION

This invention relates to a method of operating an oscilloscope.

Until recently, most digital storage oscilloscopes had a rather low acquisition rate, such that a conventional digital storage oscilloscope might not display an infrequent event. The digital oscilloscope described in U.S. Pat. No. 5,986,637, the entire disclosure of which is hereby incorporated by reference herein for all purposes, has a very high acquisition rate which allows the user to view infrequent anomalies that might previously have been overlooked due to the low acquisition rate of a hitherto-conventional digital storage oscilloscope. After noticing an anomaly in the signal, the user might want to learn more about a potential problem that might be indicated by the signal and the user will accordingly want to adjust the acquisition parameters of the oscilloscope to trigger on the anomaly.

Current digital storage oscilloscopes have the ability to trigger on a variety of signal features. For example, one advanced trigger capability is known as runt triggering. Runt triggering is typically invoked when the oscilloscope is being used to display the waveform of a digital signal, in which rising and falling edges pass through upper and lower threshold levels. In the context of a digital signal, the term "runt pulse" is used to refer to a pulse whose amplitude is significantly less than that of the normal pulses of the digital signal, such that the leading edge of a runt pulse passes through only one of the threshold levels before the signal level returns, on the trailing edge, to the level that it had immediately prior to the leading edge.

In order to invoke runt triggering in a conventional digital storage oscilloscope, the user must select runt triggering from a trigger mode menu, measure the peak-to-peak amplitude of the runt pulse, and supply the measured amplitude value to the oscilloscope. When runt triggering is properly invoked, the oscilloscope will be triggered only if it receives a pulse of peak-to-peak amplitude less than the specified value. The user may also measure the pulse width of the runt pulse and supply this value for use in further qualifying the acquisition parameters.

Advanced trigger capabilities, such as the runt trigger capability, provide the oscilloscope with valuable qualities as a test and measurement instrument but an occasional user of the oscilloscope might not be aware of many of the advanced trigger capabilities or, if aware, might not be familiar with the procedure for setting up the oscilloscope to take maximimum advantage of the trigger capabilities.

SUMMARY OF THE INVENTION

In accordance with a first aspect of the invention there is provided a method of operating an oscilloscope that is capable of displaying simultaneously multiple waveforms representing time evolution of a signal during respective acquisition intervals, comprising (a) acquiring waveform data using a first set of acquisition parameters, (b) generating a display based on the waveform data acquired in step (a), in the event that the display generated in step (b) includes a waveform that is visually distinct from other displayed waveforms, (c) selecting a feature that distinguishes the visually distinct waveform from other displayed waveforms, (d) automatically deriving acquisition parameters that discriminate between the selected feature and other features of the displayed waveforms, (e) acquiring waveform data using the acquisition parameters derived in step (d), and (f) generating a display based on the waveform data acquired in step (e).

In accordance with a second aspect of the invention there is provided an oscilloscope that is capable of displaying simultaneously multiple waveforms representing time evolution of a signal during respective acquisition intervals, said oscilloscope comprising an acquisition means for acquiring waveform data using a first set of acquisition parameters, a display means for generating a display based on the waveform data acquired by the acquisition means, a user control means that can be used in the event that the display generated by the display means includes a waveform that is visually distinct from other displayed waveforms to select a feature that distinguishes the visually distinct waveform from other displayed waveforms, and an oscilloscope control means for automatically deriving acquisition parameters that discriminate between the selected feature and other features of the displayed waveforms, and for supplying the derived acquisition parameters to the acquisition means, whereby the acquisition means can acquire waveform data using the derived acquisition parameters and the display means can generate a display based on the waveform data acquired by the acquisition means using the derived acquisition parameters.

BRIEF DESCRIPTION OF THE DRAWINGS

For a better understanding of the invention, and to show how the same may be carried into effect, reference will now be made, by way of example, to the accompanying drawings, in which.

DETAILED DESCRIPTION

Figure 1:
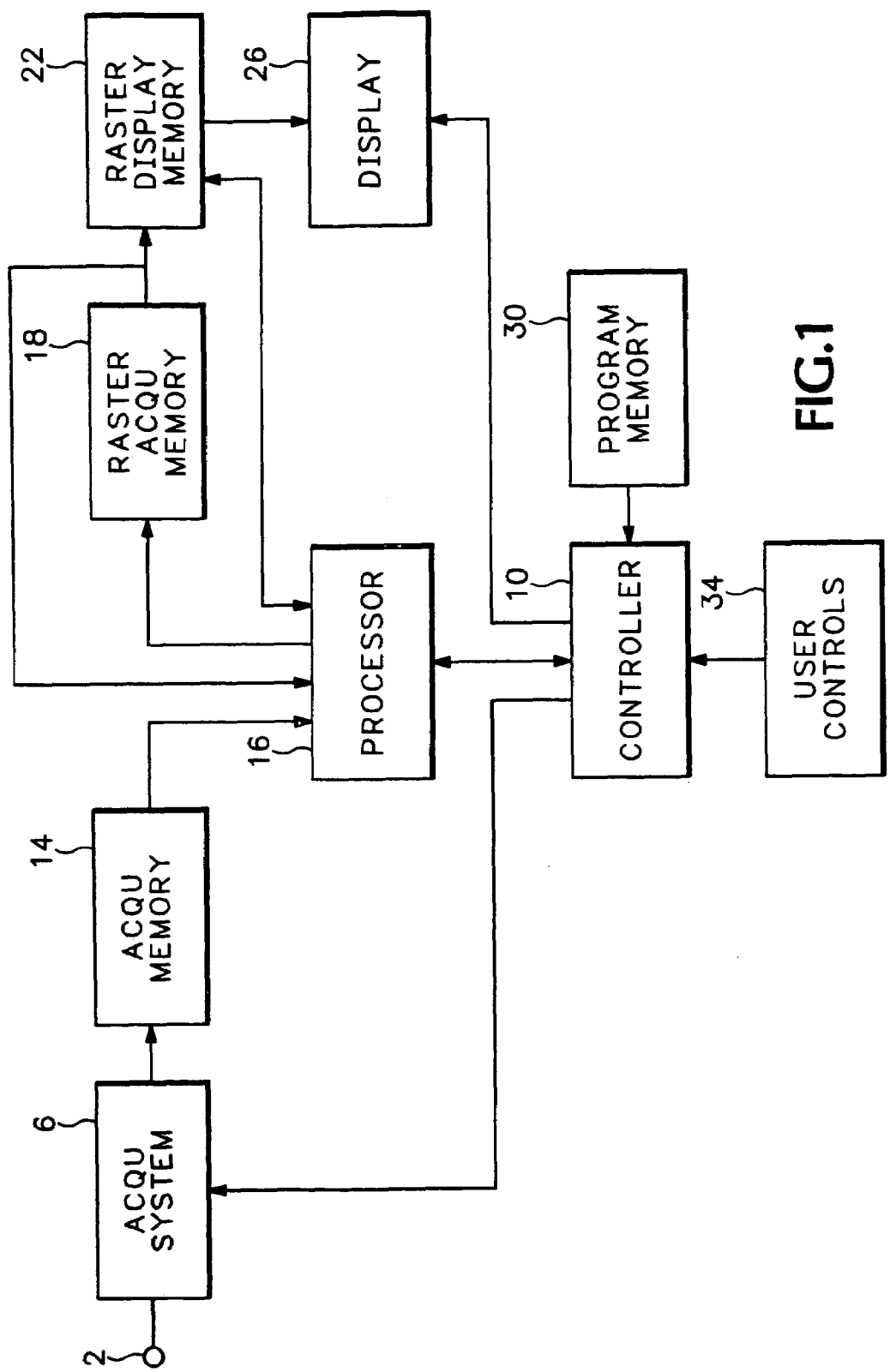
FIG. 1 is a simplified block diagram of a digital storage oscilloscope.

FIG. 1 is a greatly simplified block diagram of an oscilloscope of the kind described in U.S. Pat. No. 5,986,637. A signal under test existing at a test point 2 is applied to an acquisition system 6 through suitable interface circuitry (not shown). The acquisition system 6 includes an analog-to-digital converter (ADC) by which the signal is sampled and quantized. The ADC operates continuously, generating a continuous stream of digital words, and the acquisition system segments the stream of digital data words into multiple linear waveform records by reference to occurrences of a trigger event. Each linear waveform record represents the time evolution of the signal under test during an acquisition interval. The waveform records are loaded into an acquisition memory 14.

The oscilloscope also includes a processor 16, which rasterizes several waveform records from the acquisition memory 14. The processor combines the rasterized waveform records with a composite raster image stored in a single bit raster acquisition memory 18 and loads the new composite raster image back into the raster acquisition memory 18. When the raster aquisition memory contains the results of a selected number of acquisitions, the processor 16 overlays the single bit composite raster image stored in the acquisition raster memory on a multi-bit raster image which is stored in a raster display memory 22. This multi-bit raster image is decremented periodically to produce a persistence effect. The contents of the raster display memory 22 are used for updating a raster display 26.

Operation of the oscilloscope is controlled by the controller 10, the major functions of which can conveniently be considered to be distributed between an acquisition controller and a display controller, which are not separately shown. The controller supplies acquisition parameters, such as the trigger event, sampling rate and ADC conversion range, to the acquisition system. Algorithms for executing operations to be performed by the controller 10 are stored in a program memory 30. The oscilloscope has front panel user controls 34 which allow the user to adjust the manner of operation of the oscilloscope. The user controls include a pointing device and cursor controls.

Figure 2:
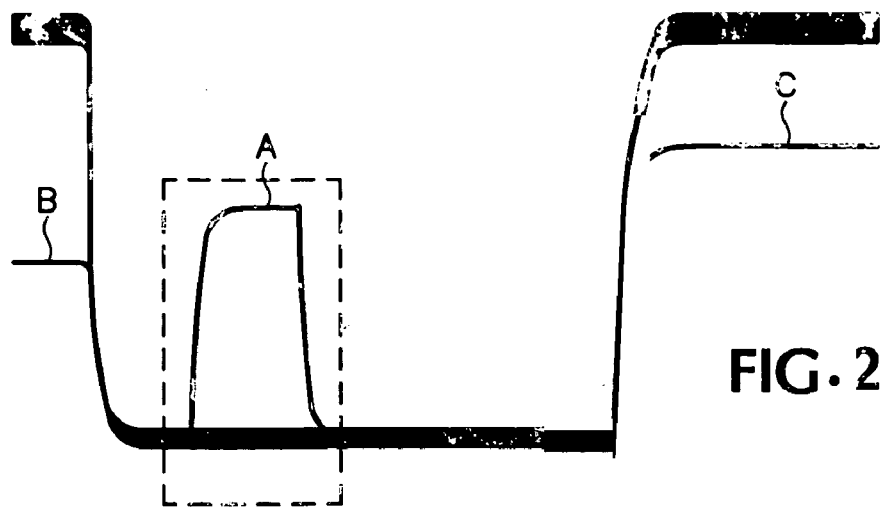
FIG. 2 illustrates a typical display provided by a digital storage oscilloscope of the kind shown in FIG. 1.
Figure 3:
FIG. 3 illustrates the waveform of a signal during a first acqusition interval.

FIG. 2 illustrates a typical display provided by the digital storage oscilloscope shown in FIG. 1 when operating in the AUTOSET mode, in which the controller automatically adjusts the acquisition parameters so that the oscilloscope displays one or two cycles of the waveform at its fundamental frequency and the voltage range of the signal fills almost the entire vertical height of the display screen. It is evident from the distribution of dense and sparse line segments of the display that the waveform normally has a configuration similar to that shown in FIG. 3 but that there are less frequent occurrences of the features designated A, B and C in FIG. 2. The user can readily determine by inspection of the display that feature A is a runt pulse, but the context in which runt pulse occurs is obscured by the normal waveform. In particular, it is impossible to determine from the display shown in FIG. 2 whether there is any relationship between runt pulse and feature B and/or feature C.

Figure 4:
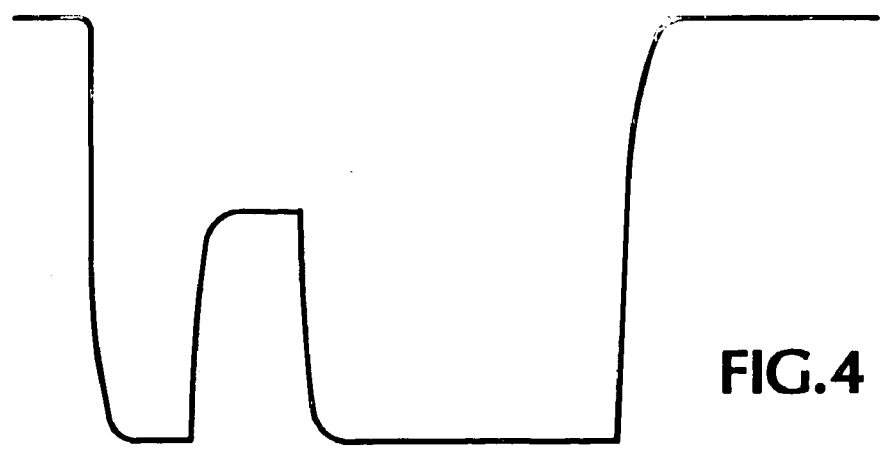
FIG. 4 illustrates the waveform of a signal during a second acqusition interval.

In order to allow the user to gain more information regarding the runt pulse, a trigger setup could be defined to capture only waveforms including a runt pulse. A user who is familiar with the advanced triggering capabilities of the oscilloscope would measure the amplitude and pulse width of the runt pulse, select the runt trigger mode, and transfer the measured values to the appropriate trigger menu parameters. The display that results might be as shown in FIG. 4, where the waveform segment including the runt pulse is shown more clearly than in FIG. 2 and there is no apparent relationship between the runt pulse and feature B or feature C. A user who is not familiar with the runt trigger mode of operation could experience difficulty in adjusting the set-up of the oscilloscope to provide the display shown in FIG. 4.

The display memory 22 has a two-dimensional address. One component of the address corresponds to the voltage level of the input signal and maps to vertical position on the display 26 and the other component corresponds to time of occurrence and maps to horizontal position on the display. The value stored at a given memory location is a measure of the frequency of occurrence of the particular combination of voltage level and time of occurrence represented by the address of that location. It will be appreciated that the contents of the raster display memory 22 constitute a database of the frequency of occurrence of each of the voltage levels represented by the first component of an address to the memory.

In the case of the display illustrated in FIG. 2, the database stored in the display memory indicates that most of the events represented by a voltage, time pair lie either within a narrow range at the top of the voltage range represented by the first address component or within a narrow range near the bottom of the voltage range. This characteristic can reasonably be interpreted as indicating that the signal under test is a digital signal. Generally, a digital signal is characterized by upper and lower threshold values that are crossed by the rising and falling edges of the pulses forming the digital signal. Based on the voltage distribution of the events represented by the contents of the display memory, and information regarding conventional digital signal practice, the display controller can determine appropriate threshold levels.

In accordance with a first embodiment of the invention, the user employs the pointing device to define a scaleable rectangular box on the display screen. The technique for displaying such a scaleable rectangular box is well known. The user employs the pointing device to select a point on the display screen as an anchor for one corner of the box and to adjust selectively the size and aspect ratio of the box by dragging the diagonally opposite corner. The display controller modifies the display to include the box. The vertical dimension of the box represents a voltage range and the horizontal dimension of the box represents a time interval. The user adjusts the size and position of the rectangular box so that it surrounds the feature of interest. The vertical dimension of the box then represents a voltage range associated with the feature and the horizontal dimension of the box represents a time interval associated with the feature. The display controller supplies the coordinates of the corners of the box to the processor 16, which uses the coordinates to derive values specifying the voltage range of the feature and the duration of the feature. The processor compares the voltage range represented by the rectangular box with the database contents and the result of the comparison implies that the waveform feature specified by the rectangular box is a runt pulse. The acquisition controller automatically invokes the runt trigger mode and sets the amplitude and time interval for runt triggering based on the voltage and time values.

In the case of a signal that provides the display illustrated in FIG. 2 when the trigger is set on the falling edge of a pulse, and the scaleable rectangular box is positioned as shown in dashed lines in FIG. 2, the display might be as shown in FIG. 4.

Many oscilloscopes have multiple channels which allow the oscilloscope to display simultaneously the waveforms of at least two signals. The oscilloscope makes an acquisition of the two signals in response to occurrence of a trigger event that has been defined with respect to one of the signals. Often, the user will be interested in relationships between the two signals. However, the conventional multi-channel oscilloscopes are subject to the previously discussed limitation of the low acquisition rate and since they do not display infrequent events they do not allow the user to observe relationships between infrequent events in the two signals respectively.

A practical implementation of the oscilloscope described in U.S. Pat. No. 5,986,637 has multiple channels. The user can therefore observe infrequent events, but without knowing how to invoke advanced trigger capabilities the user might not be able to separate infrequent events of interest from the clutter of the normal waveforms.

In accordance with another embodiment of the invention, the user can use an oscilloscope of the kind described with reference to FIG. 1 when viewing multiple channels to investigate relationships between two events when at least one of the events is infrequent without necessarily being aware of the optimum set-up of the oscilloscope. The user can employ the pointing device to define two scaleable boxes, around features in the two channels respectively, as described above. At least one of the features may represent an infrequent event. The processor can calculate voltage ranges and time intervals associated with the two boxes respectively, and a time interval between the two boxes, and can modify the acquisition parameters to acquire only waveforms that include the two features with the specified time relationship. The oscilloscope then displays only waveforms that include the infrequent events and the user is able to observe relationships between the events in the two channels.

Alternatively, the user can use the pointing device or cursors to sketch a trigger template that highlights features of interest of the two waveforms. The user can sketch the shape of the waveform of interest on the display, using the display of infrequent events as a pattern or guide. The processor can determine time values and voltage levels from the sketch and automatically adjust the acquisition parameters to acquire only waveforms that satisfy these parameters.

The delay holdoff feature that is used in conventional digital storage oscilloscopes that display two waveforms allows commencement of the acquisition of a delay record to be held off or postponed relative to an event in a main record (referred to as the main event) until a prescribed condition has been satisfied. For example, if the main event is a rising edge, the delay record will not start until after the event has occurred and the additional condition has been satisfied. The additional condition might be lapse of time, alone or in combination with another condition. The other condition may be occurrence of a specified number of events, such as rising edges in the waveform of the signal on which the delay record is based. In this case, the delay record is enabled on occurrence of the main event and acquisition starts after occurrence of the specified number of events. Delay holdoff is useful for observing complex relationships between signals. However, the user might not understand how best to use the delay hold off function in the case of infrequent events.

In accordance with a third embodiment of the invention, the user can select waveform features of the delay record and the main record and the processor can automatically qualify the acquisition parameters to refine the delay holdoff function so that only acquisitions that include selected infrequent events will be displayed.

It will be appreciated that the invention is not restricted to the particular embodiment that has been described, and that variations may be made therein without departing from the scope of the invention as defined in the appended claims and equivalents thereof.

What is claimed is:

1. A method of operating an oscilloscope that is capable of displaying simultaneously multiple waveforms representing time evolution of a signal during respective acquisition intervals, comprising:
    (a) acquiring waveform data using a first set of acquisition parameters,
    (b) generating a display based on the waveform data acquired in step (a), in the event that the display generated in step (b) includes a waveform that is visually distinct from other displayed waveforms,
    (c) selecting a feature within the displayed waveforms that distinguishes the visually distinct waveform from other displayed waveforms,
    (d) automatically deriving a second set of acquisition parameters that discriminate between the selected feature and other features of the displayed waveforms,
    (e) acquiring waveform data using the second set of acquisition parameters derived in step (d), and
    (f) generating a display based on the waveform data acquired in step (e).

2. A method according to claim 1, wherein step (c) includes graphically defining a template that specifies the selected feature and step (d) includes employing information regarding the template to derive said second set of acquisition parameters.

3. A method according to claim 1, wherein the oscilloscope has multiple trigger modes, step (c) includes graphically defining a template that specifies the selected feature and step (d) includes employing information regarding the template to select a trigger mode for preferentially acquiring waveforms that include the selected feature.

4. A method according to claim 3, wherein the template is a scalable rectangular box and step (c) includes positioning and sizing the box so that it contains the selected feature.

5. A method according to claim 2, wherein the oscilloscope has a display screen on which the waveforms are displayed and the template is a sketch generated on the display screen.

6. An oscilloscope that is capable of displaying simultaneously multiple waveforms representing time evolution of a signal during respective acquisition intervals, said oscilloscope comprising:
    an acquisition means for acquiring waveform data using a first set of acquisition parameters,
    a display means for generating a display based on the waveform data acquired by the acquisition means,
    a user control means that can be used in the event that the display generated by the display means includes a waveform that is visually distinct from other displayed waveforms to select a feature within the displayed waveforms that distinguishes the visually distinct waveform from other displayed waveforms, and
    an oscilloscope control means for automatically deriving a second set of acquisition parameters that discriminate between the selected feature and other features of the displayed waveforms, and for supplying the second set of acquisition parameters to the acquisition means, whereby the acquisition means can acquire waveform data using the second set of acquisition parameters and the display means can generate a display based on the waveform data acquired by the acquisition means using the second set of acquisition parameters.

* * * * *